United States Patent [19]
Spors

[11] Patent Number: 4,984,653
[45] Date of Patent: Jan. 15, 1991

[54] LOUDSPEAKER ARRANGEMENT

[76] Inventor: Wolfgang Spors, Schilfgraben 21, D-2150 Buxtehude, Fed. Rep. of Germany

[21] Appl. No.: 364,433

[22] PCT Filed: Oct. 2, 1987

[86] PCT No.: PCT/DE87/00447

§ 371 Date: Jun. 1, 1989

§ 102(e) Date: Jun. 1, 1989

[87] PCT Pub. No.: WO88/04514

PCT Pub. Date: Jun. 16, 1988

[30] Foreign Application Priority Data

Dec. 2, 1986 [DE] Fed. Rep. of Germany ....... 3641094

[51] Int. Cl.$^{5}$ ................................................ H05K 5/00
[52] U.S. Cl. .................................... 181/148; 181/144; 181/150; 181/154; 181/155; 181/199
[58] Field of Search ............... 181/150, 155, 148, 199, 181/144, 154

[56] References Cited

U.S. PATENT DOCUMENTS

| | | | |
|---|---|---|---|
| 2,038,253 | 4/1936 | Wheeler et al. | 181/155 |
| 2,858,899 | 11/1958 | Lopez-Henriquez | 181/155 |
| 3,263,769 | 8/1966 | Mercurius | 181/155 |
| 3,642,091 | 2/1972 | Nohara et al. | 181/150 |
| 4,227,050 | 10/1980 | Wilson | 181/155 X |
| 4,313,521 | 2/1982 | Rodden | 181/155 X |
| 4,593,784 | 6/1986 | Flanders | 181/155 X |

FOREIGN PATENT DOCUMENTS

| | | | |
|---|---|---|---|
| 970228 | 8/1958 | Fed. Rep. of Germany | 181/155 |

*Primary Examiner*—Benjamin R. Fuller

[57] ABSTRACT

The invention relates to a loudspeaker arrangement in which, in front of the loudspeaker (5) or another sound source, when viewed in the direction of the sound projection, two, preferably plane, sound guide surfaces (2,3) are disposed which, in a bow-like manner, are inclined towards one another at an obtuse angle. The projected sound is better distributed hereby and a good stereophonic effect is achieved. This applies particularly to a stereophonic arrangement with at least two loudspeakers (5).

19 Claims, 4 Drawing Sheets

LOUDSPEAKER ARRANGEMENT

SCOPE OF APPLICATION

The present invention relates to a loudspeaker arrangement in which the sound from at least one loudspeaker or some other sound source is directed via sound guide compartment means to sound emission apertures.

STATE OF THE ART

Such a loudspeaker arrangement, particularly as a loudspeaker box, is known in different forms of construction. A loudspeaker arrangement of this kind may be equipped with several loudspeakers, preferably with different frequency response, such as tweeter loudspeakers and woofer loudspeakers.

In known loudspeaker arrangements, the sound is projected at a more or less narrow angle so that the impression of a relatively concentrated sound source is created. For stereo signals, two such loudspeakers are disposed a certain distance from one another and triggered by different signals.

A loudspeaker arrangement is already known in which the sound is conducted from at least one loudspeaker or some other sound source via sound guide compartments to sound emission apertures. In this arrangement, provision is made for two, preferably plane, sound guide surfaces being disposed, when viewed in the direction of the sound projection, opposite the loudspeaker, which sound guide surfaces are, in the manner of a ship's bow, inclined towards one another at an obtuse angle, wherein the angle bisector (reference angle bisector) located approximately at the center of the height or the width, respectively, of the sound guide surfaces, is directed at least approximately at the center of the loudspeaker (U.S. Pat. No. 2,858,899).

In another known loudspeaker arrangement, provision is made for housing walls to be constructed above the loudspeaker above the loudspeaker at an angle to the sound guide, which cover the space between the loudspeaker and the sound guide surfaces. In this case, consisting the loudspeaker is disposed on a loudspeaker baffle which is a little larger than the loudspeaker aperture and likewise functions as a sound guide surface (FR-PS No. 2 579 852).

TECHNICAL PROBLEM—SOLUTION—ADVANTAGES

The present invention is based upon the technical problem of providing a universal hi-fi sound reflection loudspeaker arrangement that is accommodated inside a more or less compact housing and which, with its special properties, constitutes a universal hi-fi sound reflection box which, for the generation of stereophonic sound and/or the reproduction of sounds which appear to be perceived within a closed room giving the sensation of recording-hall acoustics and orchestra instrument location, as well as for particularly plastic and natural sound reproduction up to artificial head reproduction, is unrestrictedly suitable within all ranges and consequently constitutes a unique, distinctive, universal hi-fi sound reflection box that is independent of enclosed rooms or spaces.

This technical problem is solved by the features characterized in the claim 1.

Provision is made here that, opposite the loudspeaker(s), viewed in the direction of the sound projection, there is arranged a sound guide surface which distributes and deflects the impinging sound at least approximately uniformly, of a partial segment of a cylinder, a sphere or else two, preferably plane, sound guide surfaces which, in the manner of a ship's bow, are inclined towards one another at an obtuse angle and upon which, with or without a rigid connection, geometric bodies may be placed or inserted, wherein the angle bisector (reference angle bisector) located approximately at the center of the height or the width, respectively, of the sound guide surfaces, is directed at least approximately to the center of the loudspeaker(s) and/or the loudspeaker baffle, which is mounted in the direction of a predetermined sound distribution corner, this arrangement being surrounded by a sound guide compartment comprising several sound guide surfaces (top and terminal surfaces) which is provided with two sound emission apertures. In this arrangement, the loudspeaker or the sound source may also be formed by loudspeaker systems with different frequency characteristics and one or several loudspeaker systems of different types may be employed, e.g. diaphragm loudspeakers, piezo loudspeakers or the like.

A loudspeaker arrangement is also capable of supplying partly open rooms of any size with sound or may be employed at any locality whatever in the open—provided that an acoustic power adequate for a living-room is available—an optimal and plastic acoustic exposure to sound in the open which is limited only by the laws of nature in the volume to be created. By the provision of two loudspeakers or the like disposed in a side-by-side arrangement and by the disposition of a partition between them, it is possible to subdivide the acoustic spaces formed from the loudspeakers up to the sound outlet, preferably symmetrically, wholly or partly, so that, when triggered by stereo signals, a stereo reproduction is possible. If two or more loudspeaker arrangements for monophonic or stereophonic reproduction are used at the delimitation of a room or enclosed space, it is generally possible to create an acoustic space which, in a spatial respect, is very largely independent of the surroundings which renders possible a plastic stereophonic reproduction of the respective original recording character including that of unrestricted artificial head recording signals with faithful effect. It is then possible, at any point whatever within as well as without the acoustically created space, to perceive an excellent plastic audio impression, even if one or the other of the listeners present in this space were to move freely about in any direction without any impairments in the tonal quality and/or sound displacements or shifts of the reproduction occurring.

EMBODIMENT OF THE INVENTION

According to a preferred embodiment of the invention, above and/or below the louspeaker, vertically or horizontally to the sound guide surfaces that are inclined towards one another, upon which or between which, with or without any rigid connection, geometric bodies may be placed or inserted, or, in lieu of which, a sound guide surface in the form of a partial cylinder segment or of a sphere may be located, at least horizontal top surface is disposed which covers the space between the loudspeaker and the sound guide surface(s). A closed acoustic space is thus formed, by means of which the sound from the loudspeaker is, in each case, spatially deflected in two different directions and projected at approximately oppositely located sound emission apertures.

On the loudspeaker, at least one horizontal surface may, e.g. above and/or below, be provided with an approximately right-angled corner that may be designated as the front corner. This front corner may also cover the loudspeaker, the angle bisector of this corner being aligned at least approximately parallel to the reference angle bisector of the sound guide surfaces. The sound from the loudspeaker is thus projected on to the bow-like edge of the sound guide surfaces and/or on to geometric bodies placed in front of the same, if necessary, even only in part, or inserted between said bow-like edge with or without a rigid connection or approximately onto the center of a one-piece sound guide surface having the form of a partial segment of a cylinder or a sphere and is there split into approximately equal parts and deflected into approximately opposite directions.

The loudspeaker may be expediently mounted on a loudspeaker baffle which is only slightly larger than the sound aperture of the loudspeaker, the loudspeaker baffle being by preference smaller than the double of the corresponding dimensions in height and width of the loudspeaker aperture. If, for instance, the loudspeaker has an oval aperture of 10×15 cm, the baffle may have a dimension of 15×20 cm. In the case of loudspeakers disposed in a side-by-side arrangement, a corresponding enlargement of the dimensions then results in the width of the entire arrangements.

According to an expedient development of the invention, the surface of the loudspeaker aperture or of the loudspeaker baffle is mounted inclined at an angle of approximately 45° underneath the right-angledly constructed corner of the upper top surface.

According to an advantageous development of the invention, on at least one sound guide surface, an additional sound guide surface may be mounted. With such a sound guide surface which, by way of example, is fitted in a hinged manner, the projection direction of the sound can still be subsequently influenced. Adjacent sound guide surfaces are advantageously inclined towards one another at an obtuse angle of 100° to 170°, by preference between 120° to 160°.

According to a preferred embodiment of the invention, the lower and the upper horizontal surfaces are, at least in part, constructed as approximately superjacent squares which, at their edges, are partially interconnected by terminal surfaces in such a way that, laterally of the loudspeakers up to the next square corner between the horizontal surfaces, one aperture each is formed, and in that, from said square corner up to the sound guide surfaces, particularly at their edges, are connected by means of terminal surfaces. Hereby partly closed sound guide compartments are formed in front of the loudspeaker in both directions of the flow of sound, said compartments being provided with sound emission apertures from which the sound is projected plastically with equal intensity.

According to a further embodiment of the invention, the space behind the loudspeaker or the loudspeaker baffle may communicate by means of an aperture with a compartment mounted underneath the lower horizontal surface while, on the rear corner located opposite the loudspeaker corner, apertures are provided which pass through both horizontal surfaces in the direction from the bottom towards the top and closed at the sides. The sound thus projected from the rear of the loudspeaker is directed into the bottom compartment constructed as a resonant cavity and, from there, on to the top side of the upper horizontal surface. On the upper horizontal surface, a further, if necessary, multiple sound guide assembly may be installed, with the aid of which, the upwardly guided sound is deflected forwardly, rearwardly and/or sidewardly.

Said further sound guide assembly may have the form of the sector of a circular disk, the center of which coincides with the rear corner of the approximately square horizontal surface which is located opposite the rear corner of the front corner, in the vicinity of which the loudspeaker is disposed. This disk thus has approximately the configuration of a cylindrical (circular) cake, (but) with a (internal) cavity. The sound projected from the rear of the loudspeaker is supplied to this cavity from below via the bottom compartment and is subsequently deflected within the disk sector in the direction towards its periphery, the peripheral surface being constituted of an acoustically transparent material, e.g. a grid.

According to a development of the invention, within this further sound guide assembly, at least one sound dividing surface may be arranged that extends radially to the corner of the disk sector. An improved directional effect in the sound projection can thus be achieved.

If necessary, a special sound guide channel, e.g. in the form of a tube having a circular or square cross section, may lead from the bottom compartment to the lower or also the upper aperture on the rear corner. In this way a certain selection of intensity and/or frequency response of the sound from the bottom compartment for projection above the upper horizontal surface is possible.

According to another development of the invention, the sound may be guided on two further, preferably plane, sound guide surfaces that are installed behind the first sound guide surface and which project sidewardly and/or rearwardly, if necessary, via at least one sound deflection surface by means of which the sound is deflected, e.g. in the forward direction. The sound can be supplied to the further sound guide surfaces from the bottom compartment.

According to a development of the invention, the (first) sound guide surfaces may be provided with at least one aperture by means of which an acoustic communication with the space behind the sound guide surfaces is established. In this way a part of the sound is passed on from the front side of the loudspeaker towards the rear and is, if need be, mixed there with the sound supplied from the bottom compartment.

According to a development of the invention, the loudspeaker(s) and, if necessary, the loudspeaker baffle, may be assembled together with at least a section of the front corner and this assembly could constitute a detachable part of the loudspeaker arrangement. This part thus constitutes a kind of cassette which can be readily interchanged with an another. It is likewise possible according to yet another development of the invention for the sound guide and terminal surfaces, to the extent they are to be found above the lower horizontal surface, as well as the upper and lower horizontal surfaces to be constructed completely or partially hinged and/or removable and/or detachable. It is thus possible to replace the loudspeaker(s) if another frequency response or another acoustic power or, possibly, another direction of the acoustic beam is desired and, in addition, it is possible to achieve a significant facility in transporting large or musicians' loudspeaker systems of this type since, in this universal hi-fi sound reflection box construction, not only the folding of the top half saves space, but, in addition, by also removing or upwardly folding of the lower horizontal surface, underneath the same this lower acoustic compartment becomes available as stowage space during the transport.

BRIEF DESCRIPTION OF THE DRAWINGS

Embodiments of the invention are depicted in the drawings, in which.

DETAILED DESCRIPTION OF THE INVENTION AND THE BEST WAY OF PUTTING THE INVENTION TO PRACTICE

Figure 2:
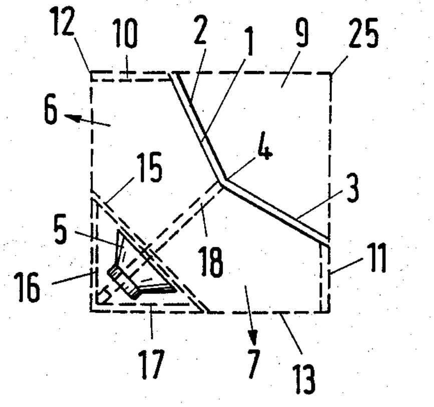

In FIG. 2, a bow-like-configured sound guide 1 is depicted which is made up of a first guide surface 2 and a second guide surface 3, which guide surfaces are assembled in the manner of a ship's bow at an obtuse angle of approximately 150°. In this case the bow forms a vertical straight line 4.

Figure 1:
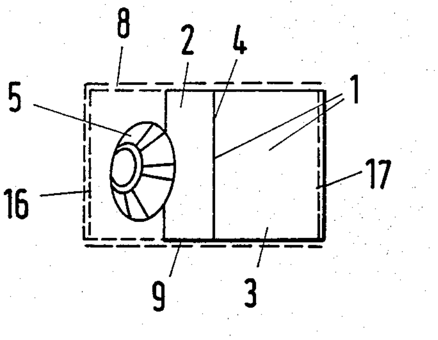
FIGS. 1 and 2 show, in a side elevation and in a top view, an arrangement according to the invention.

FIG. 1 depicts a side elevation of the arrangement forming part of the top view according to FIG. 2. In the center of the height of the sound guide 1 with its guide surfaces 2 and 3, a loudspeaker 5 is disposed opposite the bow, from which the center of its acoustic cone points approximately at the bow 4 and is aligned approximately parallel to the angle bisector of the two guides surfaces 2 and 3. The loudspeaker 5 is, on both sides of the bow 4, pointed at the guide surfaces 2 and 3 and projects sound sidewardly approximately in the direction indicated by the arrows 6 and 7 and the sound is distributed in the surrounding space.

In principle such an arrangement may be open and will, by the division of the acoustic cone from the loudspeaker 5 into the directions 6 and 7 as well as in adjacent directions, lead to a stereophonic impression of the projected sound in the vicinity.

By preference, the arrangement is covered above and below the loudspeaker 5 and the sound guide surface 1 by the horizontal surfaces 8 and 9 which may be constituted of a square board each. The space between the loudspeaker 5 and the sound guide surface 1 is closed thereby. A further narrowing and orientation of the sound emission may be achieved in that, by means of terminal surfaces 10 and 11, likwewise shown in dash lines, which may also be constituted of boards, the surface between the outer extremities of the guide surfaces 2 or 3 and of the allotted corner 12 or 13 is closed. An opening is thus formed on the sides of the loudspeaker 5 up to the front corner 14 located behind the loudspeaker between the horizontal surfaces. The sound guide surfaces 10 and 11 thus terminate at the sides of the angle of the rear corner. Preferably the loudspeaker is mounted on a baffle 15 which is slightly larger than the loudspeaker aperture, in particular smaller than the double of the corresponding dimension in height and width of the loudspeaker aperture. This loudspeaker baffle expediently seals off the space at the front corner 14 behind the loudspeaker 5. Advantageously, this entire space at the front corner 14 is also sealed towards the outer compartment by further terminal surfaces 16 and 17. Solely the sound projected from the front of the loudspeaker 5 is then supplied to the sound guide surfaces 2 and 3.

The division of the sound projected from the loudspeaker 5 can still be improved by fitting a partition 18 at the bow 4 which points on to the center of the loudspeaker 5 and, at the same time, in the direction of the angle bisector of the angle formed by the guide surfaces 2 and 3.

Figure 3:
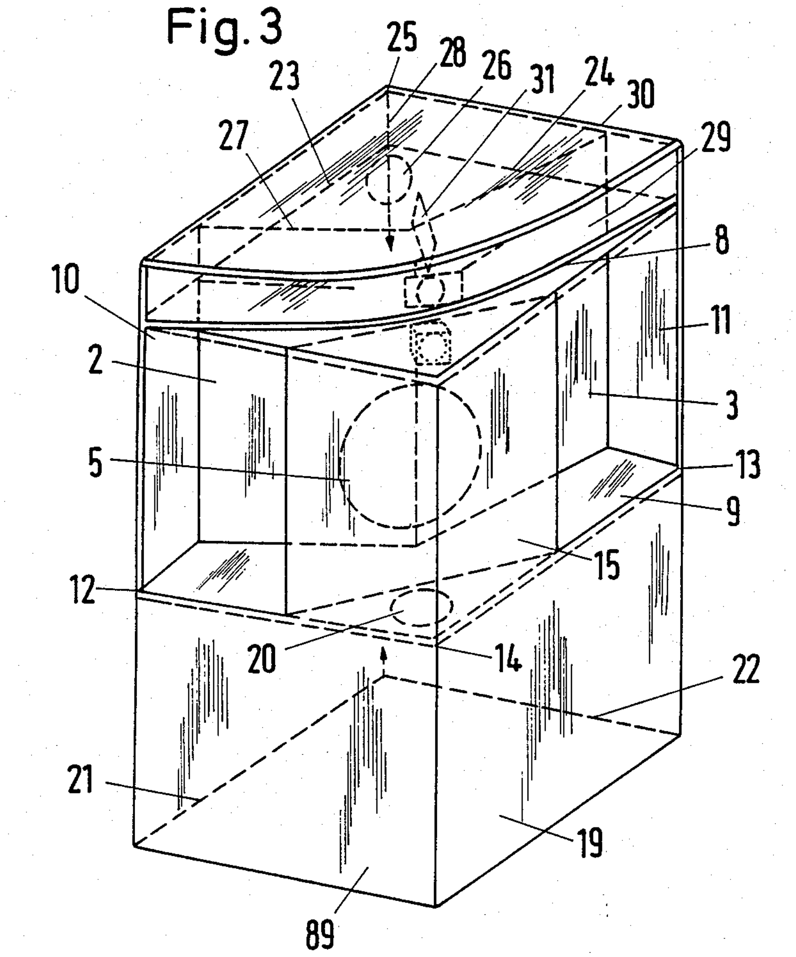
FIG. 3 shows, on another scale, an arrangement according to the invention with a bottom compartment and attached disk sector.

FIG. 3 shows an embodiment of the invention which, approximately in its top half, comprises a loudspeaker arrangement as depicted with the aid of the FIGS. 1 and 2 with the described additional parts. Furthermore, underneath the same a bottom compartment 19 is installed which, in its cross section, corresponds to the square horizontal surface 9 and which has a height corresponding approximately to that of the loudspeaker baffle 15 as well as to the height of the sound guide surface 2, 3. This bottom compartment, on the corner section adjacent to the front corner 14, communicates with the space behind the loudspeaker 5 via an aperture indicated by a dash line. This aperture may also have any other shape whatever, it may more particularly comprise the entire triangle formed between the bottom edge of the loudspeaker baffle 15 and the corner 14; in this case the lower horizontal surface 9 in this area is omitted altogether.

Through the aperture 20, sound from the rear of the loudspeaker 5 which, by way of example, is provided with a conically extending diaphragm, enters the bottom compartment 19.

Behind the sound guide surfaces 2, 3, the overall arrangement with the bottom compartment and the sound guide compartment located thereabove is closed by rear walls extending from the bottom edges 21 and 22 to the upper edges 23 or 24 and which form with one another a rear edge 25. The sound projected from the rear of the loudspeaker 5 thus reaches through the bottom compartment 19 upwardly into the space behind the sound guide surface 2, 3. In this area the upper top surface 8 is provided with an aperture indicated by the line 26 which may comprise the entire area between the sound guide surfaces and the rear walls.

The sound emitted upwardly through the aperture 26 can be deflected by means of a non-depicted, inclined sound guide surfaces in any direction whatever, especially forwardly, even passing over the loudspeaker 5. It is also possible, however, to effect a sideward deflection, according to the arrows 6 and 7 in FIG. 2, as a result of which an additional sound radiation into the front compartment is achieved.

According to a preferred embodiment of the invention, a further sound guide assembly 27 is mounted on the upper top surface 8 which has the configuration of a sector of a circular disk. The rear edge 28 which corresponds to the axis in the center of the disk, lies flush with the rear edge, likewise indicated by dash lines, of the loudspeaker arrangement, with the sound guide surfaces 2, 3 and with the rear edge of the bottom compartment 19. Since the radius of this disk is equal to the edge length of the square of the upper top surface 8, the edges of this sector, which, at its corner, likewise has an angle of 90°, are located parallel to the sides of the rear edge of the upper top surface 8, a curved front surface of this disk extends in the form of a cylinder segment.

The disk is closed towards the top by means of a board 30 as a further horizontal surface and is hollow. The cavity thus formed communicates via the aperture 26 with the bottom compartment and, via the aperture 20, with the rear of the loudspeaker 5. Into this cavity sound thus reaches from the rear of the loudspeaker and is projected forwardly by the front surface 29 since this front surface consists of acoustically transparent material, e.g. a wire grid or a fabric covering. In order to influence the sound emission in a desired manner, at least one additional sound dividing surface 31 may be arranged approximately radially to the rear corner of the disk sector 27. It is not necessary for these guide surfaces to be plane, nor do they have to fill the full height of the disk sector either; it is thus possible to bring about an influencing of the emitted sound to a desired extent.

In the FIGS. 4–9, modifications of the sound guide compartments or spaces are depicted which may advantageously be installed in the center section containing the loudspeaker, but which, if need be, may also be installed in an attachment section fitted above the center section in a similar manner as the disk sector 27 in FIG. 3. FIGS. 4–9 start out from the basic conception according to FIG. 2.

Figure 4:
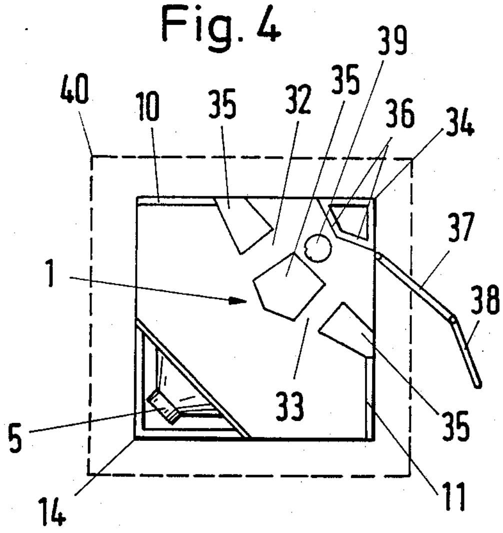
FIGS. 4–14*a* show further developments of the invention in a top view of the components mounted between the upper and the lower horizontal surfaces.

In FIG. 4 the two guide surfaces 2 and 3 of the sound guide 1 are provided with openings that are followed by acoustic channels 32 and 33 which, approximately in the center of the space located behind the sound guide 1 in front of the rear corner 34, pass into a surface 35 which extends parallel to the rear edge of this loudspeaker arrangement and perpendicularly to the diagonal from the front corner 14 to the rear corner 34. In front of the rear corner 34, a small sound guide surface 36 is arranged which essentially corresponds to the sound guide surfaces 2, 3 and which forms a bow-like edge in the direction towards the loudspeaker 5. Thus, in the arrangement according to FIG. 4, a part of the sound projected forwardly by the loudspeaker is transmitted into the space behind the sound guide surfaces and projected sidewardly there. With the aid of further sound guide surfaces 37 and 38, the sound can be additionally deflected and thus improve the stereophonic effect of the overall arrangement. It is also possible to provide, in front of the small sound guide surface 36, a suitably configured aperture 39 leading to a bottom compartment and, in this way, to additionally mix sound from the rear of the loudspeaker.

In order to reduce the downward sound projection and to thus improve the sound projection at the level of the ears of the audience, a horizontal surface may be installed, preferably approximately at the height of the lower horizontal surface extending circumferentially, completely or in part, around the loudspeaker arrangement as is indicated at 40.

Figure 5:
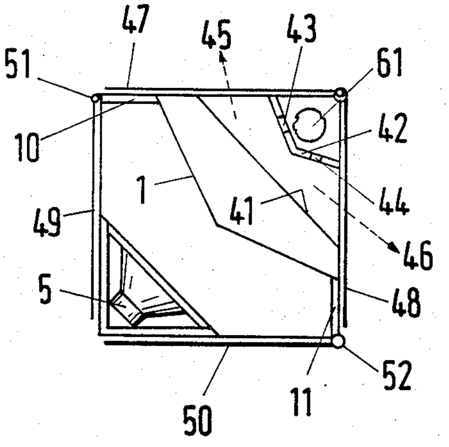

According to FIG. 5, behind the sound guide 1, similarly to FIG. 4, a straight partition 41 is fitted which, however, does not have any apertures. Opposite to said partition, likewise analogously to FIG. 4, a small bow-like angled sound guide surface 42 is fitted and provided with apertures 43 and 44. Behind the sound guide surface 42, an opening having any configuration whatever, e.g. a circular aperture 61, is provided leading through the lower horizontal surface to the non-depicted bottom compartment. It is thus possible for sound to travel from the rear of the loudspeaker 5 via the apertures 43, 44 of the small sound guide surface 42 into the space in front of the partition since the space around the aperture is closed on the sides which constitute the corner 34. The sound that impinges upon the partition 41 can then be projected to the outside according to the arrows 45 and 46. In FIG. 5, additional sound guide surfaces 47, 48, 49 and 50 are indicated which are hingedly mounted on the rear corner 34 or on the lateral corners 51 and 52, and can consequently be swung out as desired.

Figure 6:
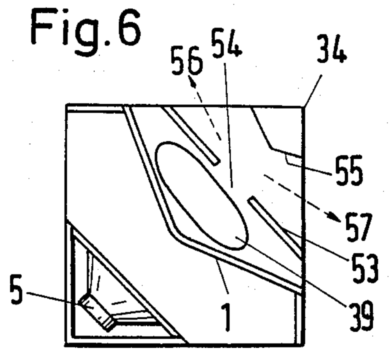

In FIG. 6, behind the sound guide 1, just like in FIG. 5, a straight partition has again be inserted. This partition, however, is provided with an aperture 54. Opposite this aperture, in front of the corner 34, once again a small angled sound guide surface 55 forming a bow is installed which is continuous. Between the sound guide 1 and the partition 53, an indicated aperture 39 possessing any desired configuration whatever is provided leading through the lower top surface to the bottom compartment.

In FIG. 6, sound thus travels from the bottom compartment through the aperture 54 to the front of the small sound guide surface 55 and is projected sidewardly according to the arrows 56 or 57. Here, too, additional, if necessary, swivellable, sound guide surfaces may be installed as depicted in FIG. 5 and described.

Figure 7:
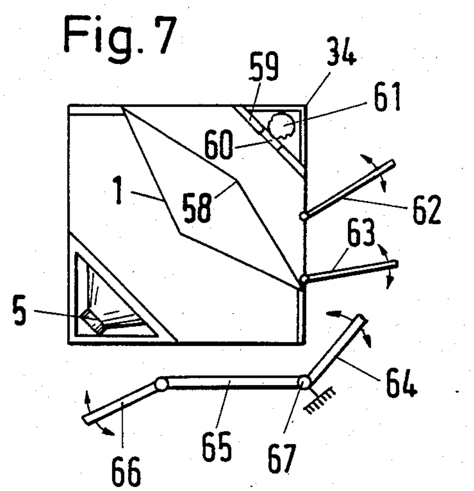

FIG. 7 shows a further embodiment of the invention in which, behind the sound guide 1, a further, approximately likewise configured sound guide surface 58 is disposed, the bow of which, however, points in the opposite direction, viz. towards the rear corner 34. In front of this corner, at a distance of approximately 15% of the length of the diagonal, a straight wall 59 is fitted which is provided with an aperture 60. Behind this wall 59, in the corner, an aperture 61 is provided having any configuration whatever but shown to be circular in FIG. 7 which leads to the bottom compartment (see FIG. 3).

The FIGS. 4–9 depict modifications of loudspeaker arrangements according to the invention in which, for the sake of a better graphic quality, the upper horizontal surface 8 has been removed so that the components in the interior between the to surfaces become visible.

In FIG. 7, the sound is thus directed from the bottom compartment into the space behind the wall 59 and, via the aperture 60, to the further sound guide surface 58 and then projected sidewardly.

Adjustable sound control surfaces 62, 63, 64, 65 and/or 66 may be installed in front of the sound emission apertures which are either secured to the housing of the loudspeaker arrangement by means of a hinge or the like or else on a fixed point 67 mounted outside the loudspeaker arrangement.

With the aid of these longitudinal surfaces, especially in accordance with local environmental conditions in which the loudspeaker arrangement is set up, it is possible to change the sound distribution to a desired extent.

Figure 8:
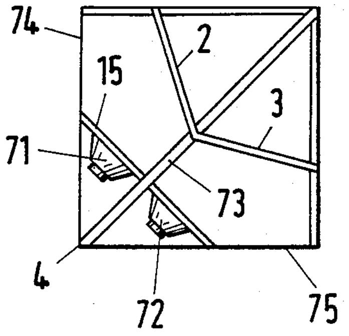

FIG. 8 shows a loudspeaker arrangement according to the invention for stereophonic reproduction. In this arrangement, as has already been mentioned with the aid of FIG. 2 and the following figures, two loudspeakers 71 and 72 are provided arranged side by side on a baffle board, this baffle board being inclined at about 45° opposite the sides constituting the corner 14, or at about 90° opposite the diagonal of the square formed by at least one horizontal surface. A partition 73 is fitted in said diagonal which continues as far as into an existing bottom compartment and also into a possible disk-shaped attachment section (27 in FIG. 3), so that the acoustic compartments are subdivided, preferably symmetrically, by the two sound sources up to the sound emission apertures (74, 75 and the like, e.g. in the disk-sector-shaped attachment section).

Figure 9:
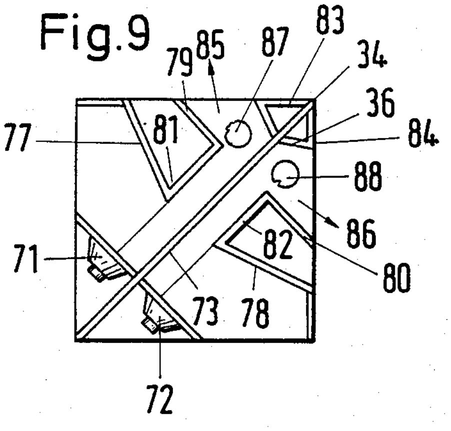

FIG. 9 depicts such a loudspeaker arrangement which is constructed analogously to FIG. 4. In this arrangement, an aperture is provided in the direction towards the rear corner 34 in the vicinity of the bow of the sound guide surfaces 77 and 78 which, further back, pass through plane surfaces 79 and 80 which are in alignment. The surfaces 77 and 79, or 78 and 80, respectively, are interconnected parallel to the partition 73 by surfaces 81 and 82. In the corner 34, similarly to FIG. 4, further sound guide surfaces are installed in a bow-like manner, that is to say inclined towards one another at an obtuse angle. The small sound guide surfaces are closed towards the rear by wall members 83 and 84.

The sound projected from the loudspeaker 71 or 72 which passes through the aperture between the connecting surfaces 81 and 82 as well as the center partition 73, is projected at the apertures between the surfaces 79 and 80 and 36 according to the arrows 85 and 86. If necessary, it is possible to provide yet one more aperture indicated by the dash line circle 87 or 88 leading to the bottom compartment so that there, too, sound is added and projected.

Figure 10:
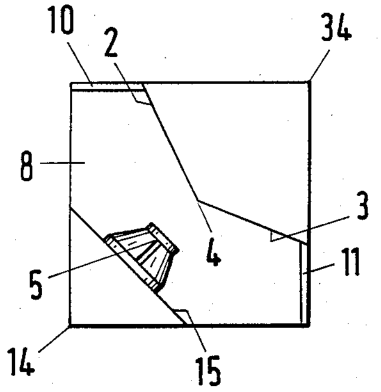

FIG. 10 shows a further loudspeaker arrangement according to the invention. In this arrangement the loudspeaker 5 is disposed in such a way that the angle bisector located approximately at the center of the height or the width of the sound guide surfaces is pointed at least approximately at the center of the loudspeaker 5, the loudspeaker 5 with its sound radiation direction projects sound on to the front corner 14 and the sound emitted towards the rear is projected via the sound guide surfaces 2 and 3 and the sound guide surfaces 10, 11.

Figure 11:
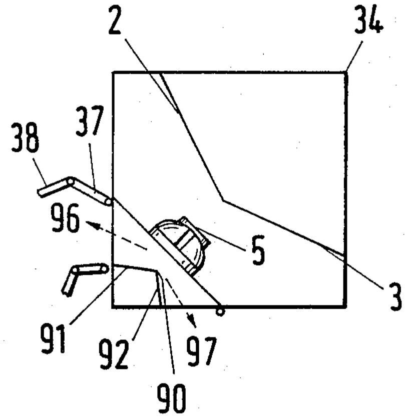

In a further embodiment of the arrangement according to FIG. 11, provision has been made that, opposite the loudspeaker disposed as per FIG. 10, when viewed in the direction of the sound projection, two sound guide surfaces 91, 92 are arranged which, at an obtuse angle and inclined towards one another, form a bow 90, as a result of which the sound emitted in the direction of the sound projection is split by the edge of the bow 90 into two approximately equal parts and is projected from the sound guide surfaces 91 and 92 as indicated by the arrows 96 and 97.

Figure 12:
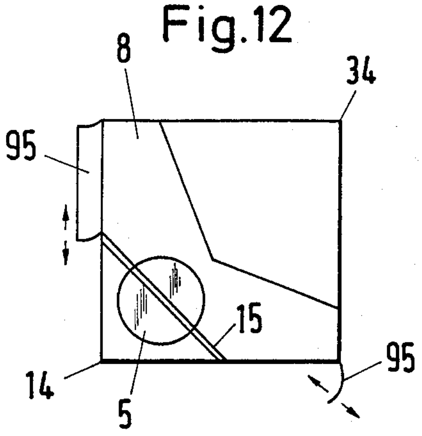

FIG. 12 depicts a loudspeaker arrangement in which provision has been made for the loudspeaker 5 to be embedded in the horizontal surface 8 and/or 9 and that, in its sound projection direction, is aimed at the horizontal surface 9 and/or 8. In this arrangement, the loudspeaker 5 may, with its center, be disposed on the line from edge 14 to edge 34, as a consequence of which the loudspeaker 5 thus forms a section of the sound source partition. In this case provision may be made for a curved sound guide baffle 95 to be installed within the area of the lateral sound emission surfaces.

Figure 13:
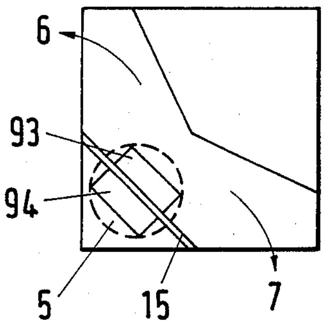

In the further embodiment depicted in FIG. 13, as compared with FIG. 12, provision is made that on the loudspeaker baffle 15, opposite the loudspeaker 5 towards the edge 14 or towards the bow-like-configured sound guide surface 1, at an angle of preferably 45° or 60°, at least one sound guide surface 93;94 extending parallel to the sound source is arranged on at least one of the lateral surfaces of the loudspeaker baffle 15. This sound guide surface 93;94 may be arranged so as to link up with the sound guide surfaces 8, 9.

Figure 14:
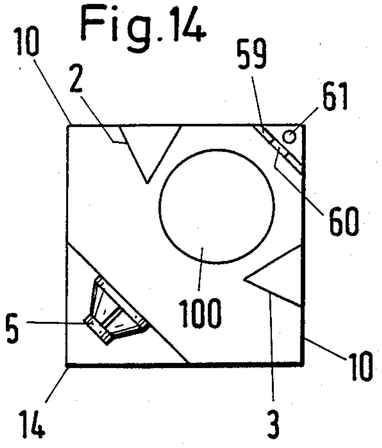
Figure 14A:
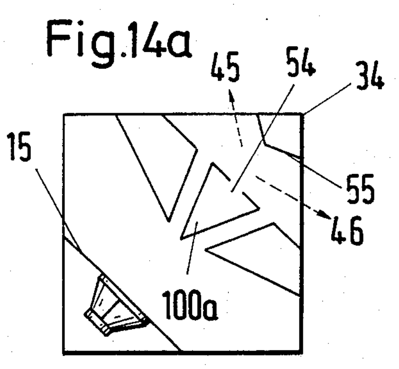

In the embodiment according to FIG. 14, provision is made that the sound emitted from the loudspeaker 5 in the direction towards the rear corner 34, is distributed within the compartment delimited by the sound guide surfaces 8, 9, 10, 11, 12, 15, 21, 22 by a sphere 100, a cylinder or some other geometric body 100*a* (FIG. 14*a*) and emitted through two or more sound emission apertures as indicated by the arrows 45, 46.

Figure 15:
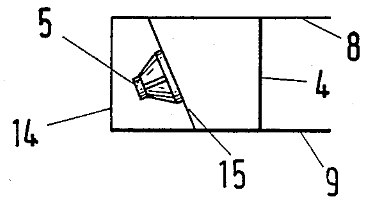
FIGS. 15–20 show further constructions of the invention in different views.
Figure 16:
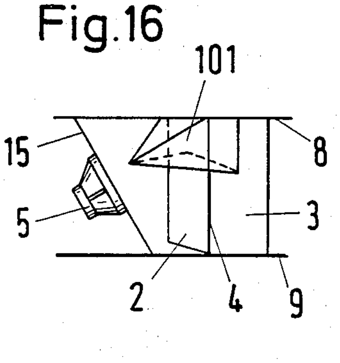
Figure 16A:
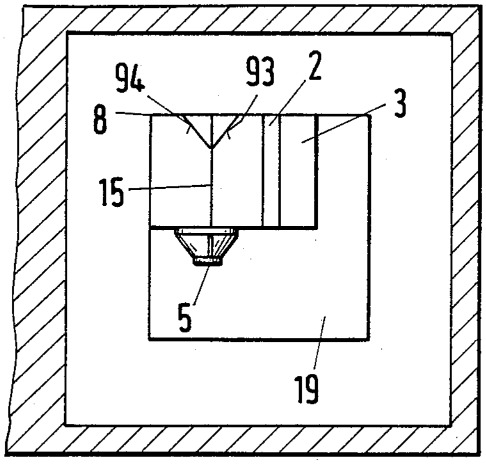

In the embodiment depicted in FIG. 15, provision is made for the loudspeaker baffle 15, between the horizontal surfaces 8, 9 towards the edge line of the front corner 14 and/or from the bow 4, not to be inclined parallely but at an angle, whereby at least one horizontal edge line of the loudspeaker baffle 15 on the predetrmined intitial line and/or below the top surfaces 8;9 is initiated and the parallely located edge line of the loudspeaker baffle 15 underneath the horizontal surface 8 and/or on the horizontal surface 9, may have a shorter distance to the edge 14 and/or 4. In this case the possibility exists of the sound guide surface 1 being at least partially adapted in accordance with the angular position of the loudspeaker baffle 15 or of the loudspeaker 5. According to a further development of this embodiment, provision may be made for the sound guide surface 1 to be aimed at, via a pyramid 101, from the pyramid point to the loudspeaker baffle 15 and/or to the loudspeaker 5 as well as at the center of the/a loudspeaker 5, it being possible for the lower edge lines of the pyramid 101 to terminate with the sound guide surfaces and/or with the horizontal surfaces, so that these edge lines may be added to the surfaces 2, 3;2, 3, 8;2, 3, 9 and/or 8, 2, 3, 9 (FIG. 16). In the embodiment depicted in FIG. 16*a*, additional provision is made that, on the loudspeaker baffle 15 opposite the loudspeaker 5, sound guide surfaces 93, 94 are installed on at least one of the lateral surfaces of the loudspeaker baffle 15, it being possible for these sound guide surfaces 93, 94 to be disposed in such a way that they link up with the sound guide surfaces 8, 9.

Figure 17:
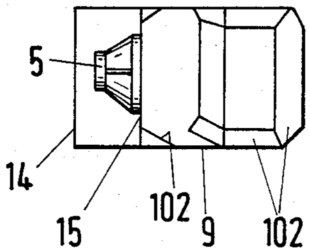
Figure 18:
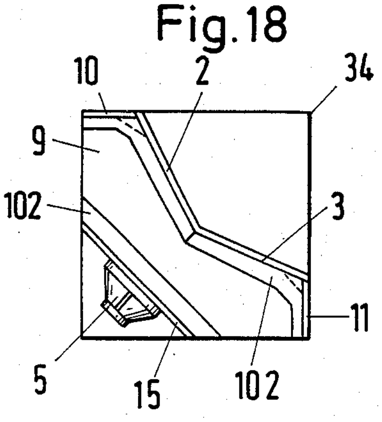
Figure 19:
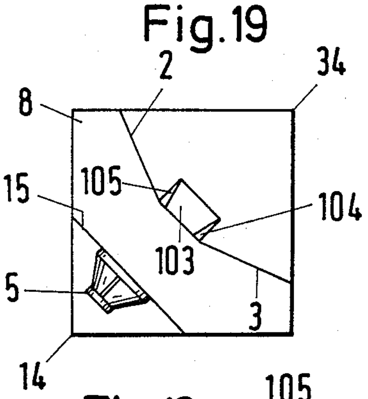

In the embodiments depicted in FIGS. 17–19, provision is made that, by way of example, the sound guide surfaces 2, 3 with their respective sizes, when viewed in the direction towards the common bow edge 4, do not form, or only partly so, this bow edge because here, between 2 and 3, at least one sound guide surface 103 (FIG. 19) or partial segments of geometric bodies link up/terminate, or that at least one complementary, angled (preferably at an angle of 45° or 60°), preferably plane, sound guide surface 102 interconnects the sound guide surfaces and/or top surfaces (FIGS. 17 and 18).

Figure 19A:
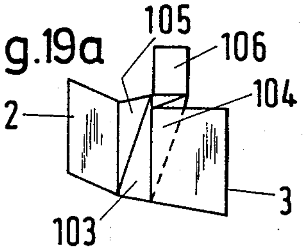
Figure 20:
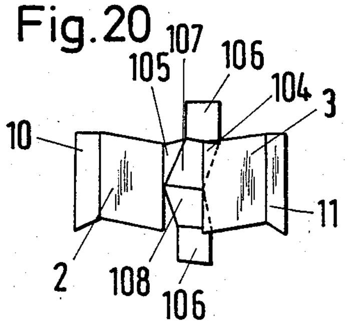

As to FIGS. 19*a* and 20, provision is made in these that one of the sound guide surfaces 103 may be arranged between the sound guide surfaces 2 and 3 relative to the loudspeaker 5 and the loudspeaker baffle 15 preferably at an angle of 45° or 60°, in which arrangement it is again possible for an aperture to be provided in the horizontal surface 8, wherein, on the horizontal surface 8 and/or on the horizontal surface 9, again a further sound guide surface 106 may be constructed at the beginning or at the end of the aperture which is mounted rigidly or hingedly. Within this area, two sound guide surfaces 107, 108 are disposed in such a way that, in relation to one another, they have the same angle as the sound guide surfaces 2, 3, but that they are arranged standing on end and, with their respective angle extremities, terminate underneath or above the horizontal surfaces 8, 9. In this case, rigid and/or movable sound guide surfaces 95, 106 may likewise link up with the respective angle extremity.

The present invention is not restricted to the embodiments of the arrangement claimed and described in the foregoing. Departures from the type of construction or the configuration of the geometric bodies come just as much within the scope of the invention as the selection of other angles or other combinations of the individual features relative to one another.

I claim:

1. A loudspeaker apparatus where sound emitted by one or more loudspeakers is directed by and through said apparatus prior to emission therefrom, said apparatus comprising:

a sound generating means for creating sound, a generally planar vertically oriented baffle carrying said sound generating means so that the sound created thereby is projected rearwardly from said baffle along a sound projection path having a generally horizontal center axis and covering a significant portion of a plane transverse to said axis, means providing two generally planar vertically extending guide surfaces for guiding and reflecting said sound, said guide surfaces being spaced rearwardly of said baffle and lying in separate planes, said guide surfaces having comparable vertical heights and being inclined towards one another at an obtuse angle so that their planes intersect in a generally vertical line, and said guide surfaces further being positioned relative to said sound projection path that a line which bisects said obtuse angle and is located at a level approximately midway along said height of said intersection line is substantially aligned with said center axis of said sound projection path, said basic guide surfaces and said sound generating means being further so relatively positioned that said sound first travels generally rearwardly from said baffle until being reflected at and divided by said guide surfaces into two separate portions each thereupon travelling in a direction extending generally forwardly from said guide surfaces and laterally and forwardly of said baffle, and means providing two horizontal generally planar sound guide surfaces for further directing said sound from said sound generating means, one of said horizontal sound guide surfaces being an upper surface located above said sound generating means and the other of said horizontal guide surfaces being a lower surface located below said sound generating means, said horizontal surfaces being vertically spaced from one another and from said sound generating means and each extending horizontally at least from said baffle to said vertical basic sound guide surfaces, said basic sound guide surfaces extending vertically between said horizontal guide surfaces.

2. A loudspeaker apparatus described in claim 1 further characterized by at least one additional generally planar vertically extending guide surface, said further guide surface being associated with one of said basic guide surfaces so as to intersect said basic guide surface in a vertical line, said vertical line being laterally spaced from said center axis of said projection path.

3. A loudspeaker apparatus described in claim 1 further characterized by said horizontal guide surfaces extending forwardly from said baffle and rearwardly beyond said basic guide surfaces.

4. A loudspeaker apparatus described in claim 3 further characterized by means providing a substantially enclosed bottom compartment located below said lower horizontal guide surface.

5. A loudspeaker apparatus described in claim 4 further characterized by means providing a rearward compartment located behind said basic guide surfaces.

6. A loudspeaker apparatus described in claim 4 further characterized by means providing a forward compartment located forwardly ahead of said baffle.

7. A loudspeaker apparatus as described in claim 6 further characterized by said means providing a forward compartment comprising said upper and lower horizontal surfaces and frontward walls, said forward compartment being substantially enclosed and being bounded above and below by said horizontal guide surfaces and laterally by said frontward walls and said baffle, said frontward walls being perpendicular to said horizontal guide surfaces and extending vertically at least therebetween, said forward compartment communicating with said bottom compartment.

8. A loudspeaker apparatus described in claim 1 further characterized by a generally planar, vertically oriented partition associated with said basic guide surfaces so that the plane in which said partition lies bisects said obtuse angle, said partition extending horizontally at least between said baffle and said intersection line of said basic guide surfaces and being positioned along said center axis, and said partition extending vertically between said upper and lower horizontal guide surfaces.

9. A loudspeaker apparatus described in claim 8 further characterized by said partition extending horizontally rearwardly from said basic sound guide surfaces into said rear compartment and forwardly from said baffle into said frontward compartment.

10. A loudspeaker apparatus described in claim 9 further characterized by said sound generating means comprising two loudspeakers disposed on opposite sides of said partition.

11. A loudspeaker apparatus described in claim 1 further characterized by said sound generating means comprising a single loudspeaker having a diameter and a central point thereon, said baffle having an aperture for said speaker and said baffle having a height less than twice said diameter, said aperture being located on said baffle so that said central axis passes through said center point of said speaker.

12. A loudspeaker apparatus described in claim 5 further characterized by means providing a substantially enclosed upper compartment overlying said upper horizontal surface.

13. A loudspeaker apparatus described in claim 12 further characterized by said means providing said upper compartment having two vertically spaced generally horizontal sound guide surfaces shaped similarly to a sector of a circular disc, said upper compartment communicating with said rearward compartment.

14. A loudspeaker apparatus described in claim 1 further characterized by means providing two additional vertically extending sound guide surfaces, each of said two additional sound guide surfaces being of comparable height to and associated with a respective one of said two basic sound guide surfaces, each of said additional sound guide surfaces further intersecting its associated basic sound guide surface along a substantially vertical line horizontally spaced from said intersection line, said additional surfaces being located adjacent said basic sound guide surfaces.

15. A loudspeaker apparatus described in claim 1 further characterized by said basic sound guide surfaces extending horizontally in one direction to said intersection line such that said basic guide surfaces are coterminous in said one direction at said intersection line.

16. A loudspeaker apparatus described in claim 1 further characterized by a three-dimensional geometric shape located between said basic sound guide surfaces.

17. A loudspeaker apparatus described in claim 16 further characterized by said geometric shape being a sphere.

18. A loudspeaker apparatus described in claim 1, further characterized by:

said sound generating means comprising a single loudspeaker, said basic guide surfaces extending horizontally toward one another so as to meet at said intersection line, four generally planar vertically oriented side walls, said walls being two frontward sidewalls and two rearward sidewalls, said frontward sidewalls being positioned generally forwardly and laterally said loudspeaker and meeting at a forward corner, said rearward sidewalls each being positioned generally rearwardly of said loudspeaker and laterally of said basic sound guide surfaces and meeting said frontward walls, said lower horizontal surface being positioned immediately below and perpendicular to said baffle and to said basic sound guide surfaces and extending laterally to each of said four sidewalls, said upper horizontal surface being located immediately above said baffle and parallel to said lower horizontal surface, said upper and lower horizontal surfaces extending forwardly past said baffle and rearwardly beyond said basic sound guide surfaces, said baffle extending vertically between said horizontal surfaces, said baffle, said means providing said horizontal guide surfaces, said means providing said basic guide surfaces, and said four side walls defining frontward, rearward, upper and lower compartments, said frontward compartment being substantially enclosed and bounded by a portion of said frontward sidewalls extending vertically between said upper and lower horizontal surfaces and having an aperture in said lower horizontal surface, said rearward compartment being substantially enclosed and bounded laterally by said basic sound guide surfaces and a portion of said rearward sidewalls and vertically by a portion of each of said horizontal surfaces and having an aperture in said upper horizontal surface, said upper compartment being bounded vertically by two further horizontal surfaces overlying said upper horizontal surface, said two further horizontal surfaces each being in the shape of a sector of a circle, said upper compartment being bounded laterally by said rearward sidewalls, said lower compartment being substantially enclosed and bounded laterally by said sidewalls, above by said lower horizontal said lower compartment being substantially enclosed and bounded laterally by said sidewalls, above by said lower horizontal surface and below by a bottom horizontal surface, said lower compartment communicating with said forward compartment through an aperture in said lower horizontal surface common to said bottom and forward compartments.

19. A loudspeaker apparatus as described in claim 18 further characterized by said upper, lower and bottom horizontal surfaces being generally square in shape, and said further horizontal surfaces being in the shape of a sector of a circle having a radius equal to the length of a side of said upper horizontal surfaces.

* * * * *